United States Patent [19]

Schlig

[11] 4,236,830
[45] Dec. 2, 1980

[54] CCD PARALLEL-SERIAL AND SERIAL-PARALLEL CHARGE TRANSFER METHOD AND APPARATUS

[75] Inventor: Eugene S. Schlig, Somers, N.Y.

[73] Assignee: International Business Machines Corporation, Armonk, N.Y.

[21] Appl. No.: 974,590

[22] Filed: Dec. 29, 1978

[51] Int. Cl.³ .................... H01L 29/78; G11C 19/28
[52] U.S. Cl. ................................ 357/24; 307/221 D
[58] Field of Search ...................... 357/24; 307/221 D

[56] References Cited

U.S. PATENT DOCUMENTS

| | | | |
|---|---|---|---|
| 3,763,480 | 10/1973 | Weimer | 357/24 |
| 3,911,467 | 10/1975 | Levine et al. | 357/24 |
| 3,946,421 | 3/1976 | Hartsell et al. | 357/24 |
| 3,967,254 | 6/1976 | Kosonocky et al. | 357/24 |
| 3,971,003 | 7/1976 | Kosonocky | 357/24 |
| 4,103,347 | 7/1978 | Barton | 357/24 |

OTHER PUBLICATIONS

Chen et al., "Parallel Signal Injection in a CCD . . ." IEEE Trans. Electon Devices, vol. ed.-25 (2/78), pp. 267-269.

*Primary Examiner*—Gene M. Munson
*Attorney, Agent, or Firm*—Pollock, Vande Sande & Priddy

[57] ABSTRACT

A charge coupled device having an interface for the transfer of charge packets between a multi-phase, multi-level parallel register and serial register. Clock-phase distribution electrodes are disposed at the interface between the serial register and the parallel register to isolate the interface ends of the phase electrodes of the serial register from the associated interface side of a parallel register electrode. Thick oxide isolation regions are positioned along the parallel register to define parallel charge transfer channels and corresponding interface charge transfer channels that have substantially the same width as the parallel charge transfer channels. The interface charge transfer channels are used to pass charge packets from the parallel charge transfer channels of the parallel register to at least two corresponding phases of the serial register.

15 Claims, 9 Drawing Figures

CCD PARALLEL-SERIAL AND SERIAL-PARALLEL CHARGE TRANSFER METHOD AND APPARATUS

DESCRIPTION

Technical Field

The invention relates to an improved parallel-serial and serial-parallel interface for a charge coupled device, and, more particularly, to such an interface including means for coupling the charge transfer channels of a CCD parallel register to corresponding portions of a CCD serial register along interface charge transfer channels having substantially the same channel width as the parallel charge transfer channels.

BACKGROUND ART

It is known in the art to couple a CCD serial register and associated CCD parallel registers to store and move charge packets corresponding to either analog or digital data. Such prior art devices typically employ either a two-level or a three-level structure to allow overlapping of successive serial electrodes and parallel electrodes and to thereby provide a means to move charge packets across the surface of a silicon substrate.

The two overlapping layers or levels of parallel and serial electrode elements are typically made of conductive polycrystalline silicon and the levels are separated by thin oxide layers. In addition, the bottom-most electrode level is also typically separated from the silicon substrate by a thin oxide layer.

Multi-phase, multi-level charge coupled devices typically employ a thick oxide isolation layer to separate parallel charge transfer channels on the parallel electrodes of the parallel registers. Such thick oxide isolation regions are typically extended into the parallel-serial interface portion of the CCD device to define interface charge transfer channels having widths that are substantially less than the widths of their corresponding parallel charge transfer channels.

The channel narrowing at the interface in prior art devices is caused by a portion of the extended thick oxide isolation region that is used to isolate the parallel electrode at the interface from corresponding serial electrodes that are positioned on the same level. The constricted interface charge transfer channels are undesirable for the reason that the narrow channels reduce the speed at which charge packets cross the interface and thereby reduce the charge transfer efficiency at the interface.

The U.S. patent to Hartsell et al., U.S. Pat. No. 3,946,421 is an example of such a multi-phase, double-level metal charge coupled device having clock phase distribution electrodes positioned apart from the parallel-serial interface and utilizing a plurality of interface channels with widths substantially less than the widths of the corresponding parallel channels of the device.

Other known CCD devices utilize clock phase distribution electrodes that are positioned between the parallel and serial registers of the device. However, the devices have also employed interface charge transfer channels of reduced width. Such devices are disclosed in "IEEE Transactions on Electron Devices, Parallel Signal Injection in a CCD Using an Integrated Optical Channel Waveguide Array," Vol. ED-25, No. 2, February 1978.

Accordingly, it is an object of the invention to provide a multi-phase, multi-level series-parallel charge coupled device having interface charge transfer channels with widths substantially the same as the widths of the associated parallel charge transfer channels.

A further object of the invention is to provide such a CCD device having serial gating electrodes disposed at the interface between the parallel CCD registers and the corresponding serial CCD register.

Another object of the invention is to provide a CCD device having thick oxide isolation regions for defining parallel charge transfer channels and interface charge transfer channels of substantially the same width, the thick oxide isolation regions being substantially the same width as a single serial electrode of the serial register.

These and other objects of this invention will become apparent from a review of the detailed specification which follows and a consideration of the accompanying drawings.

DISCLOSURE OF THE INVENTION

In order to achieve the objects of the invention and to overcome the problems of the prior art, the improved charge coupled device, according to the invention, includes a parallel register means for storing and moving a plurality of charge packets along corresponding parallel charge transfer channels. A serial register means is employed for storing and moving a plurality of charge packets along a serial channel positioned substantially perpendicular to the parallel charge transfer channels of the parallel register means.

Isolation means are provided for defining the parallel channel widths of each of the parallel charge transfer channels. Serial clock phase distribution electrodes are disposed between the parallel register means and the serial register means to couple the parallel register charge transfer channels to corresponding portions of the serial register means along interface charge transfer channels that have substantially the same width as the parallel charge transfer channels.

An embodiment of the invention employing two levels and successive groups of four electrodes in the serial register means is described. The serial clock phase distribution electrode for the first phase of the various serial groups and the serial clock pahse distribution electrode for the second phase of the various serial groups are disposed at the interface between the parallel register and the phases of the serial register.

A further embodiment is provided wherein a two-level, three-phase CCD device has two serial clock phase distribution electrodes disposed at the interface between the parallel register and the serial register. The two serial clock phase distribution electrodes are each connected to corresponding first serial phases at their respective levels and are connected together so that an energizing pulse will simultaneously energize the first phases of all of the serial groups.

BEST MODE FOR CARRYING OUT THE INVENTION

Figure 1:
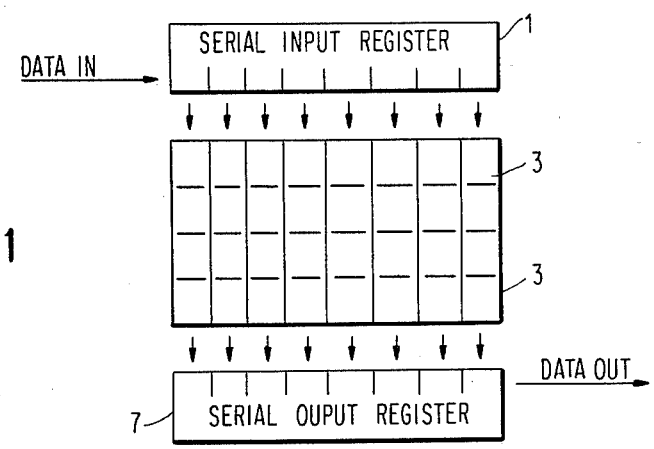
FIG. 1 shows a block diagram of a CCD serial-parallel-serial device.

The remaining portion of this specification will describe preferred embodiments of the invention when read in conjunction with the attached drawings, in which like reference characters identify identical apparatus.

FIG. 1 illustrates the general structure of a charge coupled device (CCD) having a serial input shift register 1 for receiving a serial stream of charge packets corresponding to digital or analog data. The charge packets may be shifted in a parallel fashion through a plurality of parallel shift registers 3 and passed in a final parallel shift to a serial output shift register 7. Thereafter, the charge packets may be gated from the output serial shift register 7 in a serial stream.

It will be appreciated by those skilled in the art that many CCD devices employ such serial to parallel and parallel to serial movements of data. For example, image scanners, CCD memories and CCD signal processing arrays utilize charge coupled parallel and serial registers.

A typical CCD device has a semiconductor substrate, for example of silicon, and a plurality of electrodes for moving packets of charge. The electrodes are generally arranged in a line and each electrode is positioned to overlap the next electrode in the line. The overlapping electrodes are separated by thin oxide layers so that successive electrodes are positioned at different levels with respect to the silicon substrate. Thus, for a two-level CCD device, the position of the electrodes in a line alternates between a first level that is separated from the silicon substrate by a thin oxide layer and a second level that is separated from the first level by a similar oxide layer. A three-level CCD device includes three separate layers of overlapping electrodes arranged to overlap one another in a repeating pattern. For practical reasons, commercially available CCD devices are typically constructed with two or three levels.

In operation, a packet of charge is rapidly moved over the surface of the silicon substrate of a CCD device by sequentially applying a gate voltage to the electrodes of an electrode line. More particularly, a packet of charge is temporarily stored in a semiconductor area adjacent an electrode by maintaining an appropriate gate voltage on the electrode. The gate voltage produces a potential well in the surface of the semiconductor and the potential well holds the packet of charge for as long as the electrode is energized.

A portion of the packet of charge may be moved across the surface of the semiconductor by applying a gate voltage to a next successive electrode to create an additional adjacent energy well. Thereafter, the gate voltage may be removed from the immediately preceding electrode and the entire packet of charge will move to the adjacent newly energized electrode. Of course, it should be appreciated that the packet of charge may be moved by energizing two or more adjacent electrodes to hold portions of the charge.

Figure 2:
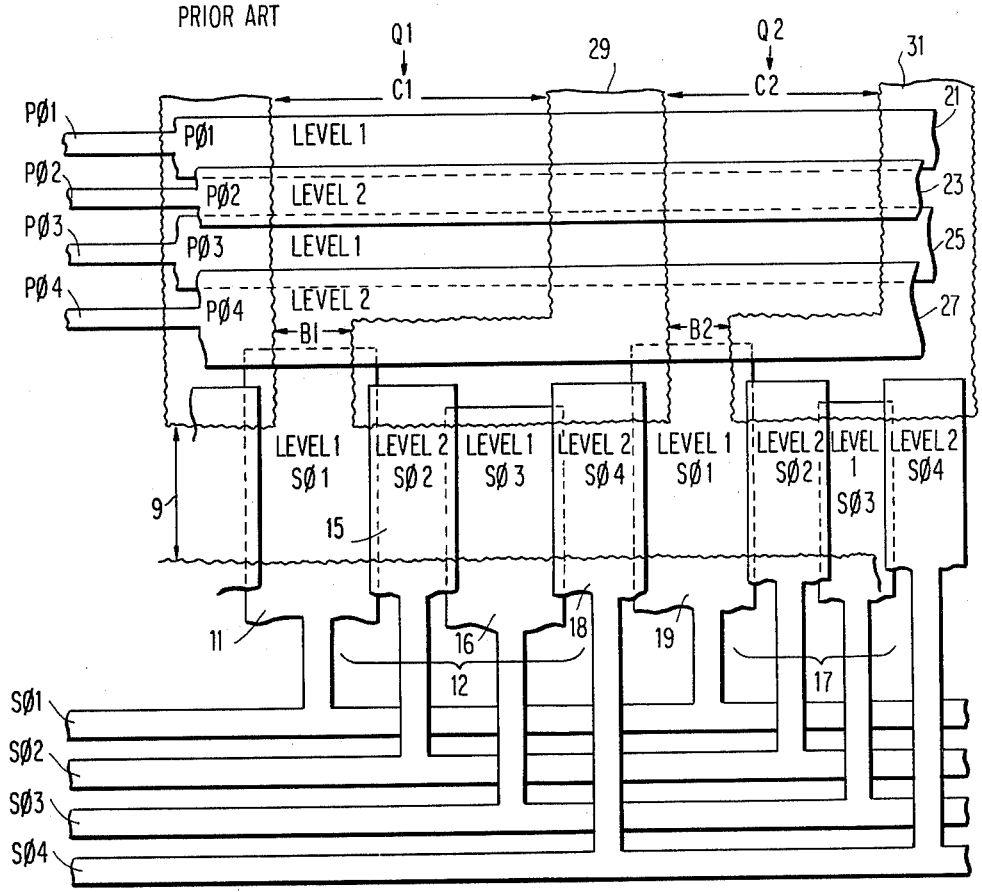
FIG. 2 illustrates the parallel to serial interface portion of a prior art CCD device.

FIG. 2 illustrates the general structure of a prior art two-level, CCD parallel-to-serial interface. The prior art CCD device of FIG. 2 employs parallel and serial registers that utilize groups of four overlapping electrodes to move packets of charge along corresponding charge transfer channels.

In the two-level electrode structure of FIG. 2, successive electrodes are overlapped and separated from one another and from the surface of the silicon substrate by a thin oxide layer. Thus, a first serial electrode 11 of a first group of serial electrodes 12 is positioned at a first level by a thin oxide layer that separates the electrode 11 from the base level of the silicon substrate. A second serial electrode 15 is positioned at a second level in an overlapping relation to the first serial electrode 11 and is separated from the first electrode 11 by an oxide layer. Succeeding electrodes are positioned at alternating levels to overlap one another.

It will be appreciated from an examination of FIG. 2 that a second group of serial electrodes 17 includes a first serial electrode 19 positioned at level 1 and second, third and fourth electrodes overlapping one another and positioned at alternate levels. Of course, it should be understood that the above-described pattern of serial electrodes may be extended to any desired length.

In a similar fashion, four parallel electrodes 21, 23, 25 and 27 of a parallel electrode group are positioned at alternate levels to overlap one another, with the first parallel electrode 21 of the illustrated parallel electrode group positioned at the first level. Of course, additional parallel electrode groups may be added to provide any number of additional parallel registers.

The operation of the prior art CCD device of FIG. 2 will be described with respect to the movement of a first charge packet Q1 and a second charge packet Q2. The charge packets Q1 and Q2 are moved along associated charge transfer channels C1 and C2 by applying a sequentially timed series of gate pulses to the parallel electrodes.

Thus, assuming that the charge packets Q1 and Q2 are respectively disposed adjacent the channels C1 and C2 of the parallel electrode 21, a portion of each of the charge packets will move to corresponding locations on the parallel electrode 21 if an energizing gate voltage is applied to the parallel electrode 21. Thereafter, the charge packets Q1 and Q2 may be moved along the channels C1 and C2 if successive energizing voltages are applied in a serial fashion to the parallel electrodes 23, 25 and 27. Of course, it should be appreciated that as each successive parallel electrode is energized, the corresponding prior electrode may be de-energized to move the charge packets into the energy well created by the most recently charged parallel electrode.

Since each parallel electrode 21-27 is a continuous conductive strip, the adjacent charge packets Q1 and Q2 will move synchronously along their respective channels C1 and C2 in response to the sequential energization of the parallel electrodes. In order to separate the adjacent charge packets Q1 and Q2, an isolation layer 29 is disposed intermediate the parallel charge channel C1 and the corresponding parallel charge channel C2. The extent of the layer 29 is illustrated in FIG. 2 by the saw-tooth line. This isolation region is typically comprised of a thick oxide layer between the silicon and the electrodes combined with channel-stop doping in the silicon surface adjacent the thick oxide. It should be appreciated that if the parallel electrodes are extended in a longitudinal direction to provide additional parallel charge channels, additional thick oxide isolation layers must be provided to isolate the parallel charge channel regions from one another.

It can be seen from an examination of FIG. 2 that at the interface between the last parallel electrode 27 and the first serial electrode 11, the parallel charge channel C1 narrows down to an interface charge transfer channel having a width B1. The narrowing of the charge transfer channel is caused by an extending portion of the thick oxide isolation layer 29. The thick oxide layer 29 is extended in such a fashion in order to isolate the second serial electrode 15 from the parallel electrode 27. Such isolation is necessary since the parallel electrode 27 and the second serial electrode 15 are positioned on the same level. Likewise, an extending portion of a corresponding thick oxide layer 31 causes the parallel charge channel C2 to narrow down to an interface charge transfer channel B2.

Thus, when Q1 and Q2 move respectively from the last parallel electrode 27 to the first and second groups of serial electrodes 12 and 17, it is necessary for the charges Q1 and Q2 to pass through the associated narrow interface channels B1 and B2 to reach the corresponding first serial electrodes 11 and 19. The passage of the charge packets through the constricted channels necessarily results in a decreased charge transfer speed and a corresponding decreased transfer efficiency.

Figure 3:
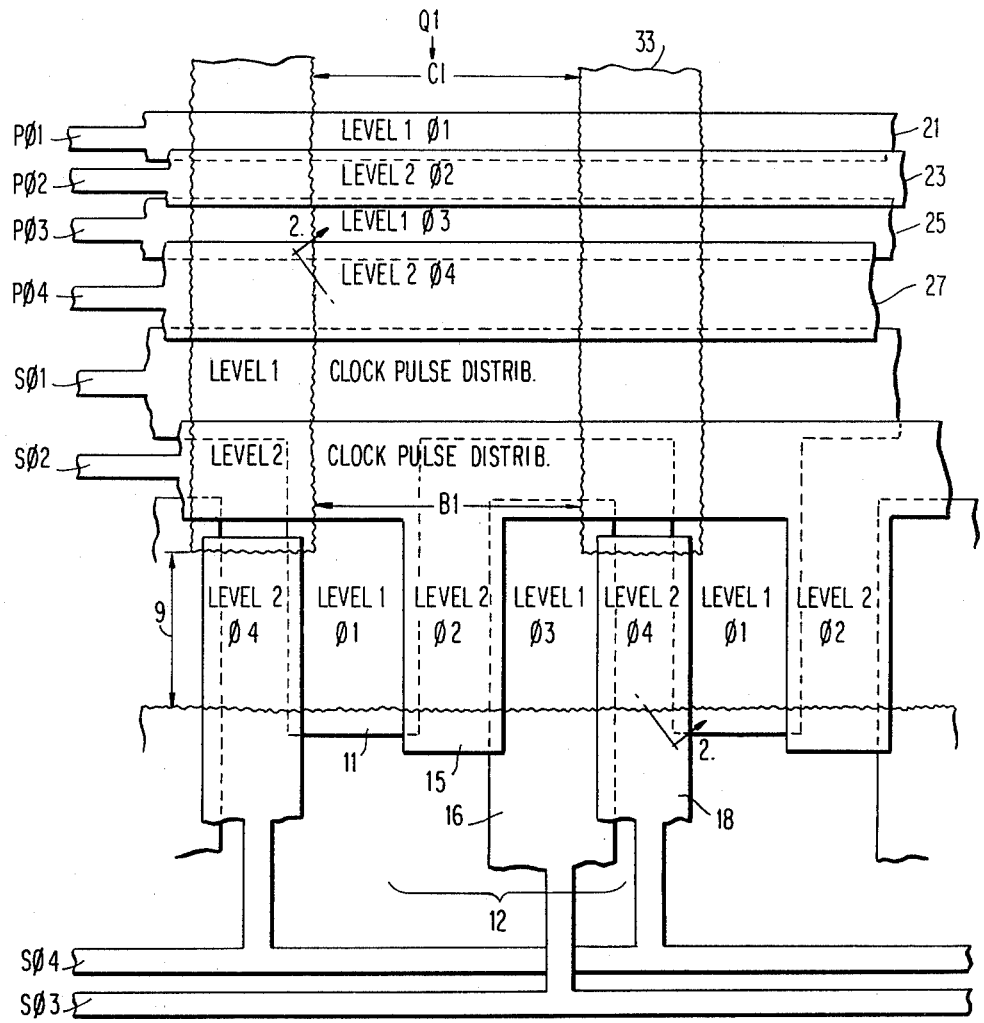
FIG. 3 illustrates the parallel to serial interface portion of a four-phase, two-level CCD device according to the invention.

FIG. 3 illustrates the construction of a two-level, four-phase parallel to serial interface for a CCD device according to the invention. It should be appreciated from an examination of FIG. 3 that the charge transfer channel C1 is not restricted by a thick oxide layer 33 and, therefore, a corresponding charge Q1 may move into its corresponding first group of serial electrodes 12 with greater speed and transfer efficiency.

In accordance with the invention, the embodiment of FIG. 3 employs two-serial clock-phase distribution electrodes that are disposed between the parallel and serial electrodes to distribute clock phase pulses to certain serial electrodes. More particularly, a serial clock phase distribution electrode S$\phi$1 for providing phase-one clock pulses to the first serial electrodes of the various serial electrode groups is positioned at level 1 in an overlapping relation to the parallel electrode 27. A serial clock distribution electrode S$\phi$2 for providing phase-two clock pulses to the second serial electrodes of the various serial electrode groups is positioned at level 2 to overlap on one side the clock distribution electrode S$\phi$1 and on the other side the interface ends of the level one electrodes of the serial shift register.

It should be appreciated that a thick oxide isolation region is not required to extend to cover the second and third serial electrodes of the serial groups since the clock distribution electrodes S$\phi$1 and S$\phi$2 provide a charge transfer path between the last parallel electrode 27 and the first three-phase electrodes 11, 15 and 16.

Thus, in operation, a charge packet may be transferred from a transfer channel of the parallel electrode 27 to at least the first and second serial electrodes, for example 11 and 15, of a corresponding group of serial electrodes. In addition, the embodiment of FIG. 3 may be operated to transfer a charge packet from a transfer channel of the last parallel electrode 27 to the first three serial electrodes, for example 11, 15 and 16, of an associated serial electrode group.

Figure 4:
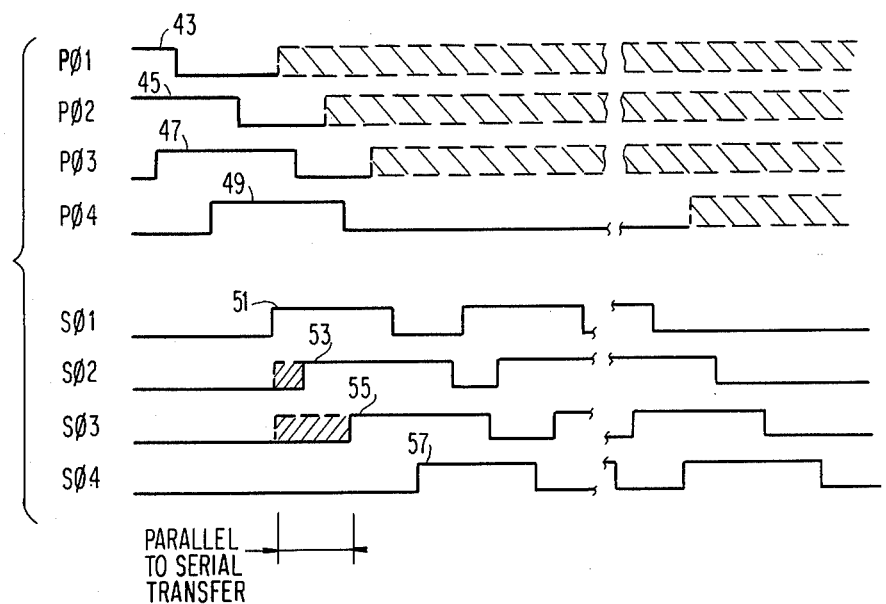
FIG. 4 illustrates a timing diagram of the clock phase signals for operating the parallel to serial interface of FIG. 3, using a four-phase, double-clocking cycle.

The four-phase, double-clocking timing diagram of FIG. 4 illustrates a sequence of clock phase pulses that may be used to move a charge packet, for example Q1, across the parallel-serial interface of FIG. 3. More particularly, the charge Q1 may be initially stored in potential wells adjacent parallel electrodes 21 and 23 which result from the energization of those electrodes by clock signals 43 and 45 applied to the parallel clock phase distribution electrodes P$\phi$1 and P$\phi$2. Thereafter, a portion of the packet Q2 may be moved to the channel C1 of the parallel electrode 25 by applying a third parallel clock phase pulse 47 to the parallel clock phase distribution electrode P$\phi$3. The first parallel clock phase pulse 43 may then be removed from the distribution electrode P$\phi$1. and all of the charge packet Q1 will then be moved to a point adjacent the channel C1 of the energized parallel electrodes 23 and 25.

A portion of the charge packet Q1 may then be moved to an area adjacent the channel C1 of the parallel electrode 27 by applying a fourth parallel clock phase pulse 49 to the parallel clock phase distribution electrode P$\phi$4. Thereafter, the second parallel clock phase pulse 45 may be removed from the parallel gating electrode P$\phi$2 to de-energize the parallel electrode 23 and to thereby move all of the charge packet Q1 to a position adjacent the channel C1 of the electrodes 25 and 27.

It should be understood that after a parallel clock phase pulse has been removed from a particular parallel clock phase distribution electrode, the immediately preceding parallel electrode may be energized to move new charge packets into position, since the removal of the clock phase pulse effectively blocks the transfer of charge from any corresponding preceding parallel electrode. Thus, the cross hatching for the clock phase pulses of FIG. 4 defines periods when the associated parallel electrodes may have new charge packets moved into position.

After a portion of the charge packet Q1 is moved into a position adjacent the channel C1 of the parallel electrode 27, a first series clock phase pulse 51 is applied to the serial clock phase distribution electrode S$\phi$1 to energize the first electrode of all of the serial groups, including the first serial electrode 11. Thus, a portion of the charge packet Q1 is moved into a position adjacent the first serial electrode 11.

As shown by the cross hatching of FIG. 4, a second series clock phase pulse 53 and a third series clock phase pulse 55 may be respectively applied to the serial distribution electrodes S$\phi$2 and S$\phi$3 at the same time that the first series clock phase pulse 51 is applied to the serial distribution electrode S$\phi$1. In the event of such a simultaneous energization of the first three serial electrodes 11, 15 and 16, a portion of the charge packet Q1 will be moved to each of the serial electrodes 11, 15 and 16. After the charge packet Q1 is moved to the serial electrodes 11, 15 and 16, the fourth parallel clock phase pulse 49 may be removed from the parallel clock phase distribution electrode P$\phi$4 and, therefore, all of the charge of the charge packet Q1 will be distributed between the energized series electrodes 11, 15 and 16.

As shown in FIG. 4, the embodiment of FIG. 3 may also be operated to initially energize only the first serial electrode S$\phi$1, including the electrode 11, to move a portion of the charge packet Q1 into a position adjacent channel 9 of the energized electrode 11. Corresponding series clock phase pulses could then be applied to the serial clock phase distribution electrodes S$\phi$2 and S$\phi$3 at later times to move respective portions of the charge packet Q1 into the later-energized series electrodes 15 and 16.

After the second and third serial electrodes 15 and 16 have been energized to retain a portion of the charge packet Q1, the first series clock phase pulse 51 may be removed from the serial distribution electrode S$\phi$1 to move the entire charge packet Q1 to the energized serial electrodes 15 and 16. Thereafter, a fourth serial clock phase pulse 57 is applied to a serial clock phase distribution electrode S$\phi$4 to energize a fourth serial electrode 18 and to thereby move a portion of the charge Q1 into a position adjacent the newly energized serial electrode 18. The second serial phase pulse 53 may then be removed from the serial distribution electrode S$\phi$2 to move the charge Q1 into a position adjacent the energized serial electrodes 16 and 18.

As shown in the timing diagram of FIG. 4, successive cycles of four-phase serial clock pulses may be applied to the appropriate serial clock phase distribution electrodes S$\phi$1–S$\phi$4 to move the charge packet Q1 along a serial register channel 9 and to thereby shift the charge packet Q1 out of the serial shift register.

It should be appreciated that although the timing diagram of FIG. 4 was discussed with respect to the energization of particular parallel and serial electrodes and the corresponding movement of a single charge packet Q1, the interface of FIG. 3 will operate to move many charge packets in response to the energization and de-energization of corresponding serial and parallel electrodes. More particularly, it should be understood that if a pulse is applied to any of the serial clock phase distribution electrodes, corresponding phases in each of the serial groups of electrodes will be energized and corresponding charge packets will be moved. Likewise, the parallel clock phase distribution electrodes control the energization of corresponding phases of parallel groups of electrodes.

In general, it should be appreciated that if there are n parallel charge channels Cl–Cn, coupled to n associated groups of serial electrodes, a series of charge packets may be transferred across the parallel to serial interface to the associated serial groups of electrodes. Thereafter, the charge packets may be shifted out of the serial register by applying at least n, four-phase serial clock cycles to the various electrode groups of the serial register. After all of the serial register charge packets are gated out of the serial register, new charge packets from the parallel electrode 27 may be gated to the energized phases of the associated groups of serial electrodes. Of course, it should be understood that once the parallel to serial transfer of charge packets is completed, the parallel electrode 27 should remain de-energized until all of the transferred charge packets are gated out of the serial register.

It should be further appreciated that while the pulse polarities indicated in FIG. 4 and subsequent timing diagrams are appropriate for N-channel CCD, P-channel technology can be employed as well, in which case all pulse polarities would be inverted.

Figure 5:
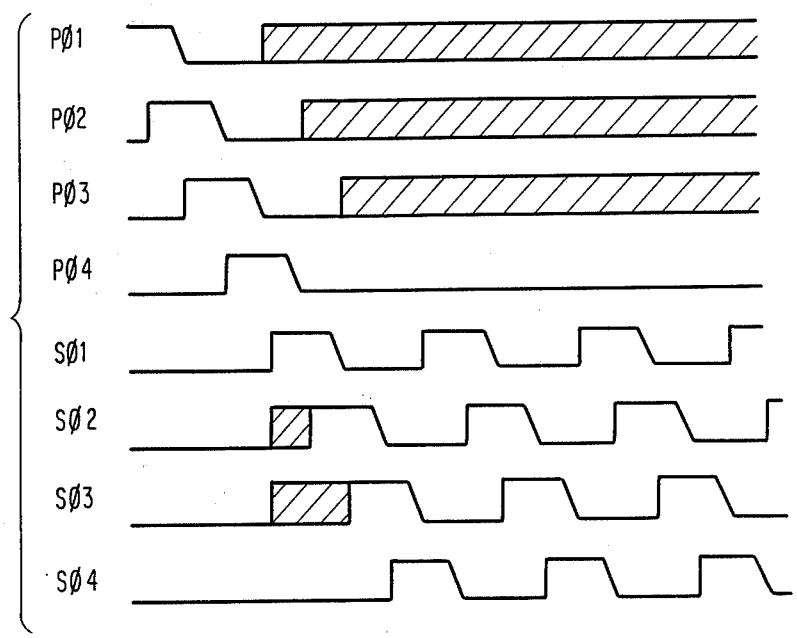
FIG. 5 illustrates a timing diagram of the clock phase signals for operating the parallel to serial interface of FIG. 3, using a four-phase, single-clocking cycle.

FIG. 5 illustrates a typical timing diagram for a parallel to serial CCD interface utilizing four phase single clocking. It should be understood from an examination of FIG. 5 that a charge packet is moved across the parallel to serial interface in much the same manner as was described for the four-phase double clocking timing diagram of FIG. 4. However, in the timing diagram of FIG. 5 it can be seen that except for the initial transfer of charge across the parallel to serial interface, the charge packets are moved in parallel and serial directions by energizing only two electrodes at one time.

Figure 6:
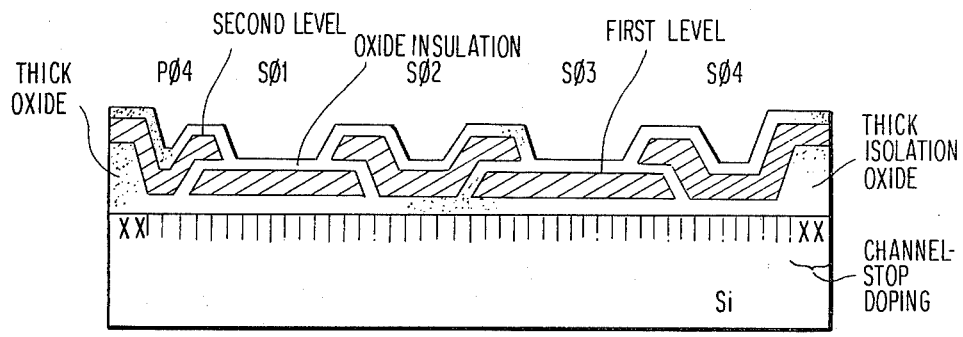
FIG. 6 illustrates a cross-section of the parallel to serial interface of FIG. 3 along a line 2—2.

FIG. 6 illustrates a cross-sectional view of the parallel to serial interface of FIG. 3 taken along a line 2—2 in the indicated direction. As can be seen from an examination of FIG. 6, channel-stop doping is provided in the surface of the silicon substrate adjacent thick oxide to ensure isolation between the various charge transfer channels. Of course, the indicated thick oxide isolation regions correspond to the regions illustrated by the sawtoothed lines of FIG. 3. Other means of isolating the channels are known in the art and may be employed instead of the thick oxide and channel-stop doping. It should be appreciated that the relationship between phase numbers and level numbers is always arbitrary, as long as successive phases do not lie on the same level.

Although FIG. 3 has been described with respect to the movement of a charge packet from a parallel electrode portion to a serial electrode portion, it should be understood that the method and apparatus of the invention may also be employed to move charge packets from a serial CCD register to parallel CCD registers. Thus, charge packets may be introduced to a serial CCD register and gated in a serial direction along the serial register channel 9 by applying four-phase serial clock cycles to the various electrode groups of the serial register.

After the serial register is filled with charge packets, the fourth serial electrode of each serial electrode group, for example 18, is de-energized and the parallel electrodes 27 and 25 are energized to receive respective portions of charge packets from the first three energized serial electrodes in each serial electrode group, for example 11, 15 and 16.

After the parallel electrodes 25 and 27 have been energized, the third serial electrode, second serial electrode and first serial electrode of each group are de-energized in a reverse sequence to move each associated charge packet to a corresponding transfer channel on the energized parallel electrodes 25 and 27. The charge packets may then be moved in the parallel registers by the usual sequence of energized parallel electrodes. Of course, after the charge packets are moved to the parallel electrodes 23 and 25 and the parallel electrode 27 is de-energized, new charge packets may be gated into the serial register.

Figure 7:
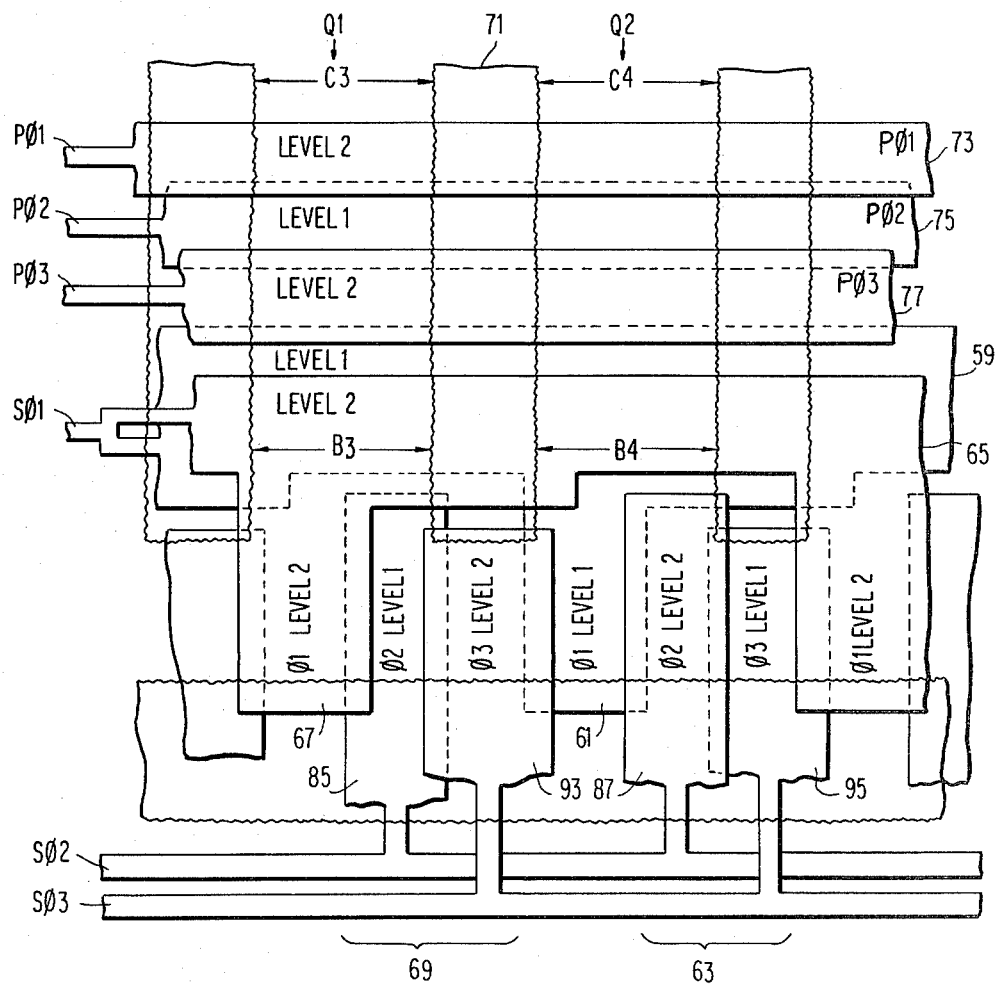
FIG. 7 illustrates a serial to parallel interface for a three-phase, two-level charge coupled embodiment of the invention.

FIG. 7 shows a parallel to serial interface having two levels and three phases for each serial or parallel electrode group. The serial electrodes are positioned on alternate levels to overlap one another in much the same fashion as was provided for the parallel to serial interface of FIG. 3. However, since the serial register portion of the interface of FIG. 7 has only three serial electrodes to a group, the matching electrodes or phases of adjacent groups are on different levels.

In accordance with the invention, a first serial clock pulse distribution electrode 59 is positioned at level 1 to overlap the parallel electrode 77 that is positioned at level 2. As shown in FIG. 7, the serial distribution electrode 59 extends to contact the first serial electrode 61 of a group of serial electrodes 63.

A second serial clock phase distribution electrode 65 is positioned at level 2 in an overlapping relation to the first serial distribution electrode 59. The second serial distribution electrode 65 extends to contact the first serial electrode 67 in a group of serial electrodes 69.

The first and second distribution electrodes 59 and 65 are cross connected so that if a serial clock phase pulse is applied to either the first or second serial clock pulse distribution electrodes 59 or 65, the first serial electrodes 67 and 61 of the groups 69 and 63 will be energized. It should be appreciated that if the serial register is extended, additional first serial electrodes of additional groups will be connected to either the first or second serial distribution electrodes 59 and 65 in the manner described.

In accordance with the invention, a thick oxide layer 71 is positioned to separate the serial electrode groups 69 and 63 and to define respective parallel channels C3 and C4 and associated interface channels B3 and B4.

Figure 8:
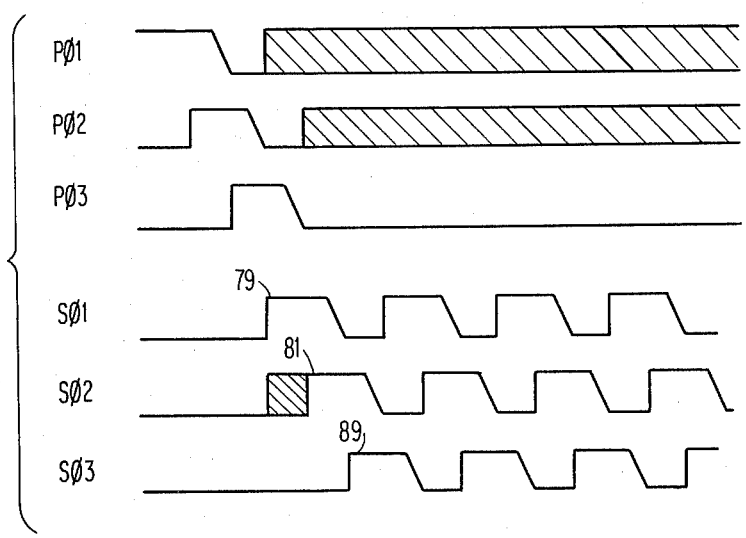
FIG. 8 shows a timing diagram of the three-phase clock phase signals for operating the parallel to serial interface of FIG. 7.

FIG. 8 illustrates a typical timing diagram for the parallel to serial transfer interface of FIG. 7, with three-phase clocking. In operation, a charge packet, for example Q1 is moved within a group of parallel electrodes 73, 75 and 77 by sequentially energizing the parallel electrodes in a manner similar to that described for the circuit of FIG. 3.

When the charge packet Q1 is moved into a position adjacent the channel C3 of the parallel electrode 77, and a second charge packet, for example Q2, is moved into a position corresponding to the parallel channel C4 of the parallel electrode 77, a serial clock phase pulse 79 is applied to energize the first and second serial distribution electrodes 59 and 65. The energized serial distribution electrode 65 causes a portion of the charge Q1 to move to the associated first serial electrode 67 and the energized serial distribution electrode 59 causes a portion of the charge packet Q2 to move to the associated first serial electrode 61.

A second serial clock phase pulse 81 may be applied to energize second serial distribution electrode Sϕ2 either at the same time as the energization of the serial distribution electrode Sϕ1 or at a later time defined by the cross hatching for the pulse 81. The energization of the distribution electrode Sϕ2 causes the associated second serial electrodes 85 and 87 to be energized and corresponding portions of the Q1 and Q2 charge packets to be moved into association with the second serial electrodes 85 and 87.

Thereafter, the serial clock phase pulse 79 may be removed and a serial clock phase pulse 89 may be applied to a third serial distribution electrode Sϕ3 to energize the third serial electrodes 93 and 95 of the groups 63 and 69 and to thereby move the corresponding portions of the charge packets Q1 and Q2 into association with the third serial electrodes 93 and 95.

It should be appreciated that the serial register of FIG. 7 may be extended by adding additional groups of serial electrodes to move additional charge packets across the parallel to serial interface in the manner described.

Figure 9:
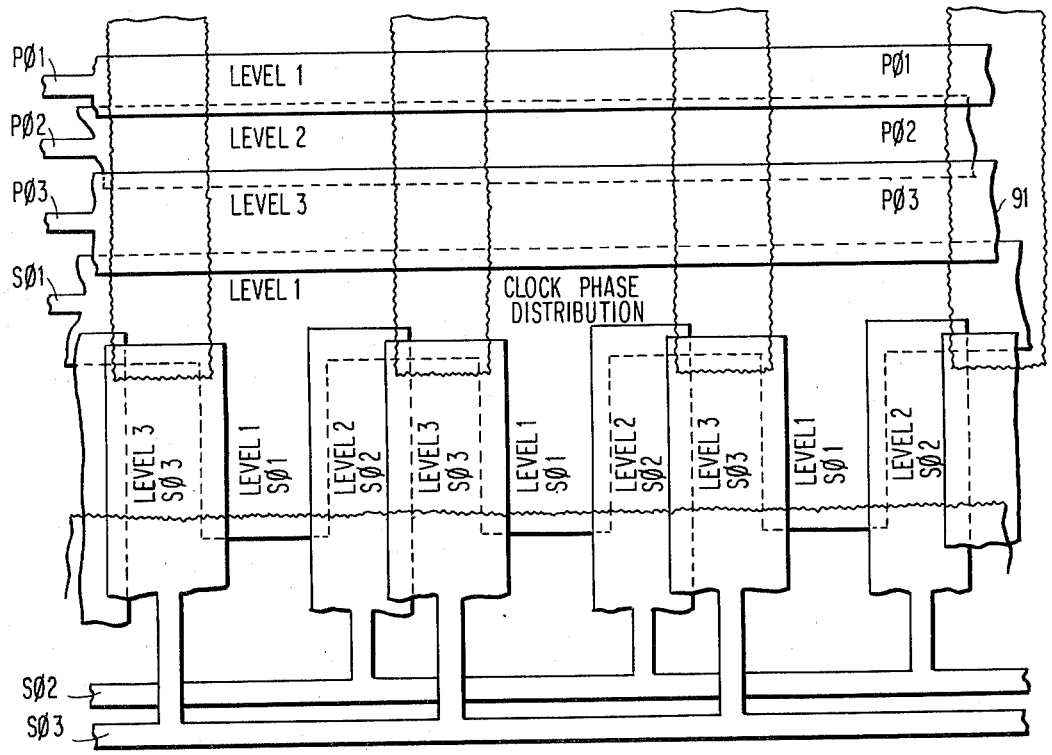
FIG. 9 illustrates an embodiment of a three-phase, three-level serial to parallel interface according to the invention.

FIG. 9 illustrates a three-level parallel to serial CCD interface employing groups of three electrodes in the serial and parallel register portions of the device. According to the invention, a serial clock phase distribution electrode for the first serial electrode or phase of each group may be disposed between the last parallel electrode 91 and the interface ends of the serial electrodes of the serial register. Of course, the serial electrodes of FIG. 9 may be gated in a manner similar to that described for the interfaces of FIGS. 3 and 7.

Various embodiments of the invention have been described that permit the transfer of charge packets between channels of the parallel electrode of a parallel register and two or more serial electrodes of each group of electrodes in a serial register. According to the invention, the transfer of charge is accomplished through interface channels having widths that are substantially the same as the widths of the associated parallel channels of the parallel register. Thus, the thick oxide isolation layer that separates parallel channels is extended to the interface and at the interface has a width that is only slightly wider than an electrode of the serial register.

It should be appreciated that, in accordance with the invention, the serial clock phase pulses may be stopped when the parallel clock phase pulses are generated or, alternatively, as is known in the art, the serial clocks may be run continuously while the parallel clock runs one cycle synchronously with the serial clock at appropriate intervals.

It should be apparent to those skilled in the art that an apparatus operating in accordance with the present invention may be employed for transferring charge between photodiodes of a linear photodiode array and the stages of a CCD shift register. It should be understood that the present invention is not limited to applications wherein only two or three levels are utilized or where only three or four electrodes are included in the serial and parallel electrode groups. The invention may be employed to eliminate channel constrictions in devices having greater numbers of levels or greater numbers of electrodes in serial and parallel electrode groups and in which the numbers of levels and electrodes may differ in the serial and parallel electrode groups.

Thus, the invention may be embodied in other specific forms without departing from its spirit or essential characteristics. The present embodiments are, therefore to be considered in all respects as illustrative and not restrictive, the scope of the invention being indicated by the claims rather than by the foregoing description, and all changes which come within the meaning and range of the equivalents of the claims and therefore intended to be embraced therein.

Having thus described my invention, what I claim is new, and desire to secure by Letters Patent is:

1. A charge coupled device, comprising:
    a semiconductor substrate;
    a plurality of parallel electrodes positioned over said substrate and arranged in insulated overlapping relation and responsive to parallel transfer voltage signals for moving a plurality of charge packets along parallel charge transfer channels thereof in said substrate;
    a plurality of serial electrodes positioned over said substrate and arranged in insulated overlapping relation and responsive to serial transfer voltage signals for moving a plurality of charge packets in a serial direction along a serial charge transfer path in said substrate;
    interface electrode means disposed between said plurality of serial electrodes and a last parallel electrode of said plurality of parallel electrodes and responsive to at least one of said serial transfer voltage signals for passing charge packets from the parallel charge transfer channels of the last parallel electrode to the serial charge transfer path of the plurality of serial electrodes over corresponding interface channels in said substrate; and isolation means for defining a parallel channel width for each of said parallel charge transfer channels and for defining an interface channel width for each of the interface channels, the interface channel width being substantially as great as the distance between the outer lateral edges of at least two of the overlapping serial electrodes.

2. The apparatus of claim 1 wherein said interface channel width is equal to said parallel channel width.

3. The apparatus of claim 1 including:

means for supporting the parallel electrodes and the serial electrodes at positions alternating between a first and a second level with respect to the substrate.

4. The apparatus of claim 3 wherein the plurality of serial electrodes are arranged in groups of four electrodes to transfer at least one packet of charge along said serial charge transfer path in response to four distinguishable serial transfer voltage signals.

5. The apparatus of claim 4 wherein said interface electrode means includes, a first serial clock electrode positioned in insulated overlapping relation to said last parallel electrode at a level opposite the level of the last parallel electrode, and responsive to a first one of said four distinguishable serial transfer voltage signals to receive charge packets at a position beneath said first serial clock electrode from the parallel charge transfer channels of said last parallel electrode and to distribute at least a portion of each of the received charge packets of a parallel charge transfer channel to a position beneath an adjacent equipotential first serial electrode in a serial electrode group, a second serial clock electrode positioned in insulated overlapping relation to said first serial clock electrode at the level of the last parallel electrode, and responsive to a second one of the four distinguishable serial transfer voltage signals to receive charge packets at a position beneath said second serial clock electrode from interface channels of the first serial clock electrode and to distribute at least a portion of each of the received charge packets of an interface channel to a position beneath an adjacent equipotential second serial electrode in a serial electrode group, and further including, a first gating means for applying a third one of the four distinguishable serial transfer voltage signals to a third serial electrode in each serial electrode group to enable each of the third serial electrodes to receive at a position beneath itself at least a portion of a charge packet from an adjacent interface channel of said second serial clock electrode, a second gating means for applying a fourth one of the four distinguishable serial transfer voltage signals to a fourth serial electrode in each serial electrode group to enable each of the fourth serial electrodes to receive at a position beneath itself at least a portion of a charge packet from a position beneath an adjacent overlapping third serial electrode.

6. The apparatus of claim 5 wherein said first serial clock electrode is conductively connected to said first serial electrode of each serial electrode group and said second serial clock electrode is conductively connected to said second serial electrode of each serial electrode group.

7. The apparatus of claim 5 wherein said isolation means defines an interface channel width that is substantially as great as the distance between the lateral edges of an area defined by the first, second and third overlapping serial electrodes of a serial electrode group.

8. The apparatus of claim 3 wherein the plurality of serial electrodes are arranged in groups of three electrodes to transfer at least one packet of charge along said serial charge transfer path in response to three distinguishable serial transfer voltage signals.

9. The apparatus of claim 8 wherein said interface electrode means includes, a first serial clock electrode positioned in insulated overlapping relation to said last parallel electrode at a level opposite the level of the last parallel electrode, and responsive to a first one of said three distinguishable serial transfer voltage signals to receive charge packets at a position beneath said first serial clock electrode from the parallel charge transfer channels of said last parallel electrode and to distribute at least a portion of each of the received charge packets of a parallel charge transfer channel to a position beneath an adjacent equipotential first serial electrode positioned in a serial electrode group at a level opposite the level of the last parallel electrode, a second serial clock electrode positioned in insulated overlapping relation to said first serial clock electrode at the level of the last parallel electrode, and responsive to said first one of the three distinguishable serial transfer voltage signals to receive charge packets at a position beneath said second serial clock electrode from interface channels of the first serial clock electrode and to distribute at least a portion of each of the received charge packets of an interface channel to a position beneath an adjacent equipotential first serial electrode positioned in a serial electrode group at the level of the last parallel electrode, and further including, a first gating means for applying a second one of the three distinguishable serial transfer voltage signals to a second serial electrode in each serial electrode group to enable each second serial electrode to receive at a position beneath itself at least a portion of a charge packet from an adjacent interface channel of the serial clock electrode that is positioned on a common level, and a second gating means for applying a third one of the three distinguishable serial transfer voltage signals to a third serial electrode to receive at a position beneath itself at least a portion of a charge packet from a position beneath an adjacent overlapping second serial electrode.

10. The apparatus of claim 9 wherein said first serial clock electrode is conductively connected to every first serial electrode that is positioned at a level opposite the level of the last parallel electrode and said second serial electrode is conductively connected to every first serial electrode that is positioned at the level of the last parallel electrode.

11. The apparatus of claim 9 wherein said isolation means defines an interface channel width that is substantially as great as the distance between the lateral edges of an area defined by the first and second overlapping serial electrodes of a serial electrode group.

12. The apparatus of claim 1 including a semiconductor substrate and means for supporting the parallel electrodes and the serial electrodes at positions alternating in sequence between a first, second and third level with respect to the substrate, the serial electrodes being arranged in groups of three electrodes to transfer at least one packet of charge along said serial charge transfer path in response to three distinguishable serial transfer voltage signals.

13. The apparatus of claim 12 wherein said interface electrode means is a serial clock electrode positioned in insulated overlapping relation to said last parallel electrode, and responsive to a first one of said three distinguishable serial transfer voltage signals to receive charge packets at a position beneath said serial clock electrode from the parallel charge transfer channels of the last parallel electrode and to distribute at least a portion of each of the received charge packets of a parallel charge transfer channel to a position beneath an adjacent equipotential first serial electrode in a serial electrode group, and further including, a first gating means for applying a second one of the three distinguishable serial transfer voltage signals to a second serial electrode in each serial electrode group to enable each of the second serial electrodes to receive at a position beneath itself at least a portion of a charge packet from an adjacent interface channel of said serial clock electrode, and a second gating means for applying a third one of the three distinguishable serial transfer voltage signals to a third serial electrode in each serial electrode group to enable each of the third serial electrodes to receive at a position beneath itself at least a portion of a charge packet from a position beneath an adjacent overlapping seconds serial electrode.

14. The apparatus of claim 13 wherein said serial clock electrode is conductively connected to said first serial electrode of each serial electrode group.

15. The apparatus of claim 13 wherein said isolation means defines an interface channel width that is substantially as great as the distance between the lateral edges of an area defined by the first and second overlapping serial electrodes of a serial electrode group.

* * * * *